United States Patent [19]

Pastor et al.

[11] 4,332,879
[45] Jun. 1, 1982

[54] PROCESS FOR DEPOSITING A FILM OF CONTROLLED COMPOSITION USING A METALLO-ORGANIC PHOTORESIST

[75] Inventors: Antonio C. Pastor, Santa Monica; Ricardo C. Pastor, Manhattan Beach; Gregory L. Tangonan, Oxnard; Shi-Yin Wong, Santa Monica, all of Calif.

[73] Assignee: Hughes Aircraft Company, Culver City, Calif.

[21] Appl. No.: 965,651

[22] Filed: Dec. 1, 1978

[51] Int. Cl.$^3$ .................. B05D 5/06; B05D 3/06; B05D 5/12

[52] U.S. Cl. .................. 430/272; 427/43.1; 427/44; 427/54.1; 427/86; 427/87; 427/96; 427/99; 427/126.1; 427/226; 427/229; 427/248.1; 427/255; 427/255.4; 427/256; 427/271; 427/272; 427/273; 427/282; 427/164; 427/165; 427/166; 430/270; 430/302; 430/311; 430/321; 430/322; 430/330

[58] Field of Search .......... 427/226, 255, 229, 256, 427/255.4, 248 E, 271, 272, 273, 282, 287, 248.1, 248 R, 343, 377, 126, 43, 43.1, 123, 44, 86, 99, 96, 87, 54, 54.1; 430/321, 311, 272, 302, 322, 270, 330; 96/33, 45.1, 162, 35.1, 36.2, 36.3, 36.4

[56] References Cited

U.S. PATENT DOCUMENTS

| | | | |
|---|---|---|---|
| 3,620,809 | 11/1971 | Flicker | 427/229 |
| 3,753,768 | 8/1973 | Ichiki et al. | 427/377 |
| 3,779,807 | 12/1973 | Taylor et al. | 427/226 |
| 3,834,939 | 9/1974 | Beyer et al. | 427/282 |
| 3,885,076 | 5/1975 | Heidenreich et al. | 427/43 |
| 3,904,783 | 9/1975 | Nara et al. | 427/43 |
| 3,925,080 | 12/1975 | Pastma | 427/229 |
| 3,977,878 | 8/1976 | Roteman | 96/86 P |
| 3,982,941 | 9/1976 | Inskip | 427/226 |
| 3,994,727 | 11/1976 | Polichette et al. | 427/43 |
| 4,027,059 | 5/1977 | Thompson | 427/229 |
| 4,039,698 | 8/1977 | Framer | 427/43 |
| 4,103,073 | 7/1978 | McAlear et al. | 427/229 |

FOREIGN PATENT DOCUMENTS 1439726 11/1968 Fed. Rep. of Germany ... 427/248 E

OTHER PUBLICATIONS

Condensed Chemical Dictionary, 6th ed., Rheinhold, N.Y., 1961, p. 195.

Primary Examiner—Michael R. Lusignan
Assistant Examiner—Janyce A. Bell
Attorney, Agent, or Firm—Mary E. Lachman; W. H. MacAllister

[57] ABSTRACT

The specification describes a process for depositing a film of controlled composition on a substrate by using a metallo-organic photoresist in which the organic portion is combusted by heating in a reactive atmosphere to leave a residual deposit of a desired substance on the substrate. The film may be formed as a patterned or unpatterned layer. In addition, the residual deposit may be subsequently subjected to a chemical reaction to alter its composition.

9 Claims, 5 Drawing Figures

PROCESS FOR DEPOSITING A FILM OF CONTROLLED COMPOSITION USING A METALLO-ORGANIC PHOTORESIST

FIELD OF THE INVENTION

This invention relates to a process for depositing a film of a substance of controlled composition on a substrate, and more particularly to a process for depositing a film using a metallo-organic photoresist which is combusted to leave a film of desired residue on the substrate.

BACKGROUND OF THE INVENTION

Photolithographic processes using photoresists are well known in the art, as discussed, for example, By William S. DeForest in the book entitled "*Photoresist Materials and Processes,*" McGraw-Hill Book Company, New York, 1975. Particular areas in which such photolithographic processes are used are in the formation of metal layers on a substrate to form metal contacts to active regions of an electronic device, in forming optical waveguides and circuits, and in forming reflecting surfaces. Using one conventional process, a patterned metal layer may be formed as follows: (1) a layer of a photoresist material is applied to a substrate; (2) the photoresist layer is irradiated through a mask defining the desired pattern; (3) the photoresist layer is developed (i.e., unpolymerized areas in a negative-acting resist or depolymerized areas in a positive-acting resist are washed away); (4) a layer of the desired metal is deposited over the patterned resist layer, usually by evaporation under vacuum; (5) the patterned photoresist is lifted off, carrying with it corresponding portions of the metal layer; and optionally (6) further processing of the metal layer may be performed. One distinct disadvantage of this conventional process is that during lift-off, the desired metal deposit could also be peeled off, which is particularly a problem when narrow line widths of metal are being formed. In addition, this process requires an expensive and time-consuming vacuum deposition process in order to form the metal layer. Furthermore, this conventional process cannot readily form patterned metal-containing layers in excess of 100 microns in thickness.

Another prior art process by which a patterned metal layer may be formed comprises the following steps: (1) a layer of the desired metal is deposited on the surface of the substrate, usually by evaporation under vacuum; (2) a layer of photoresist material is deposited over the metal layer; (3) the photoresist layer is irradiated through a mask defining the desired pattern; (4) the photoresist layer is developed; (5) an etchant is applied through the patterned photoresist layer to remove the unwanted portions of the metal layer; (6) the photoresist pattern is lifted off; and optionally, (7) further processing of the metal layer may be performed. This process has the disadvantage of requiring time-consuming and expensive evaporation and vacuum procedures and apparatus. In addition, there is the problem of undercutting which occurs when the undesired metal is etched away. Although the desired metal pattern is substantially protected from the etchant by the patterned photoresist, some etchant does flow under the edges of the photoresist pattern and etches away portions of the metal which it was desired to maintain intact (i.e., undercutting occurs). This undercutting is especially a problem when the required width of the lithographed lines is less than the thickness of the photoresist film.

If it is desired to form an unpatterned metal layer on a substrate, prior art methods such as chemical vapor deposition and electron beam sputtering are used and are well known in the art. Both methods require expensive and elaborate apparatus and are time-consuming. In addition, it is difficult to control the composition of the layer deposited by these methods. Similarly, unpatterned layers of dielectric or semiconductor materials have been formed by evaporation, electron beam sputtering, or chemical vapor deposition, which have the latter mentioned disadvantages.

With regard to prior art processes for the deposition of metal from metal-containing compositions in some cases a radiation-sensitive metal salt composition has been used as in U.S. Pat. No. 3,994,727, but no plastic or polymer constituent was used. In another case, where the photoresist as developed consisted of a cross-linked polymer containing metal ions, as in U.S. Pat. No. 3,885,076, the photoresist layer was used merely as a mask for ion-implantation or to form nucleation sites for metal deposition. In still another case, as reported by Robert G. Brault in "Properties of Metal Acrylate Compositions as X-Ray Resists", Electron and ION Beam Science and Technology, Sixth International Conference, (1974), metal has been incorporated into resists for purposes of enhancing a specific physical property of the resist, such as x-ray absorption. However, none of the above prior processes subsequently combusted the organic portion of the photoresist to leave a desired inorganic residue.

In co-pending application Ser. No. 911,543, assigned to the present assignee, an organo-metallic solution is deposited on a substrate and the organic portion is decomposed by heat to leave an inorganic residue, which is then heated to diffuse part of the residue into the substrate. However, the organo-metallic solution, which is defined as having molecules containing a carbon-metal linkage, differs chemically from the metallo-organic photoresist of the present invention, which is described in detail in the discussion of FIG. 3. Further, the layer formed by the decomposition step of the previous process is merely an intermediate step in the process of forming a waveguide device and has no function by itself, as does the layer formed by the present invention.

SUMMARY OF THE INVENTION

The general purpose of this invention is to provide a new and improved process for depositing a film of controlled composition on a substrate, which possesses most, if not all, of the advantages of the prior art processes while overcoming their significant disadvantages discussed above.

The above general purpose of this invention is accomplished by providing a new and improved process for depositing a film by using a metallo-organic photoresist which is combusted to leave a film of a desired residue on the substrate. The film may be formed as a patterned or unpatterned layer. In addition, the present invention provides a process for forming one of several desired reaction products with the residue.

In order to further accomplish this purpose, we have discovered and developed, among other things, a novel process for depositing a film of controlled composition on a substrate. First a layer of a metallo-organic photoresist of a chosen composition is deposited on the substrate to a chosen thickness. Then the deposited photoresist is heated in a chosen reactive atmosphere to elevated temperatures sufficient to combust the organic portion of the photoresist and to leave behind on the surface of the substrate an inorganic residue comprising the desired film. In a particular embodiment of the present invention, a predetermined pattern is formed in the photoresist after it has been deposited and before it is heated to elevated temperatures. As a further step, the residue may be exposed to a second selected reactive atmosphere to form a reaction product of the residue.

Accordingly, it is an object of the present invention to provide a new and improved process for depositing a patterned or unpatterned film on a substrate.

Another object is to provide a new, improved, and simplified process for depositing a film containing an inorganic substance in a predetermined pattern.

A further object is to provide a process of the type described in which the composition of the film can be closely controlled.

Still another object is to provide a process of the type described in which a patterned metal-containing film can be formed to a greater thickness than previously attained with ease.

Another object of the present invention is to provide a new and improved process for depositing a film and forming a chosen reaction product therewith.

Yet another object is to provide a process of the type described in which a phosphorescent layer is formed.

A further object is to provide a new and improved process for depositing a film containing an inorganic substance and subsequently diffusing the inorganic substance into the substrate to form an optical waveguide.

These and other objects and advantages of the present invention will become more readily apparent in the following description of the drawings and preferred embodiments of the invention.

DETAILED DESCRIPTION OF THE DRAWINGS

Figure 1:
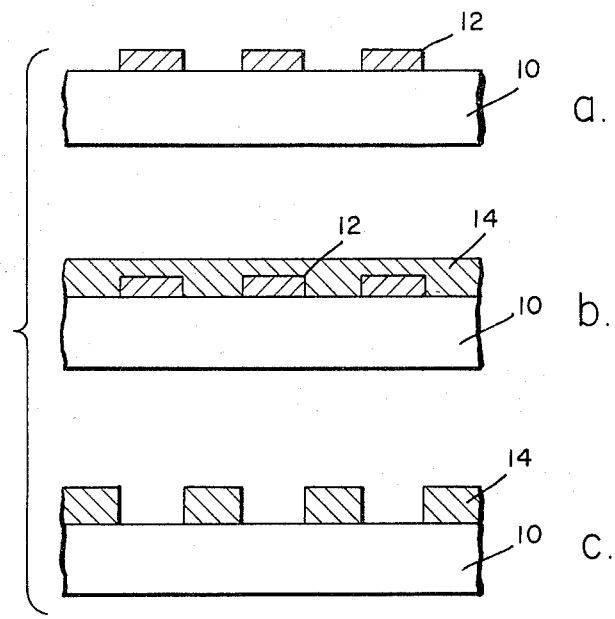
FIG. 1 illustrates, in schematic cross-section, some of the major steps in one prior art process.

FIG. 1 illustrates some of the major steps in one conventional prior art photolithographic process for depositing a layer, such as metal, on a substrate. FIG. 1a shows the substrate 10 with a patterned photoresist layer 12 deposited thereon. This patterned photoresist layer 12 is formed by well-known processes in which a layer of photoresist is deposited, then irradiated through a mask, and finally developed to remove the unwanted portions of the photoresist layer and thereby leave the patterned photoresist layer 12 shown in FIG. 1a. Next, a layer 14 of metal or other desired material is deposited over the surface of the patterned photoresist layer 12, as shown in FIG. 1b. Then, the photoresist is "lifted off," carrying with it the portions of the layer 14 which were immediately over the metal and leaving behind the remainder of the layer 14 in a pattern as shown in FIG. 1c. The disadvantages of this process have already been discussed.

Figure 2:
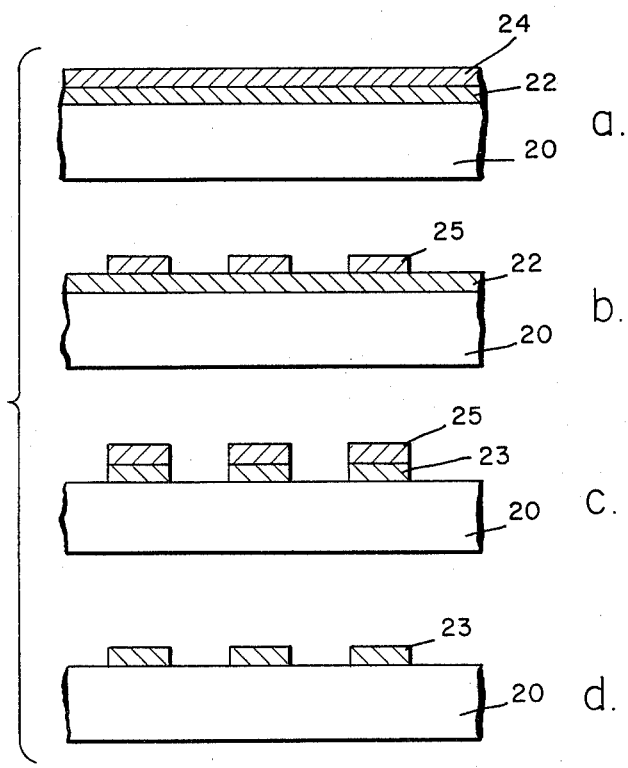
FIG. 2 illustrates, in schematic cross-section, some of the major steps in another prior art process.

FIG. 2 illustrates some of the major steps in another prior art photolithographic process for depositing a patterned metal layer on a substrate. FIG. 2a shows the substrate 20 with a layer 22 of metal deposited, for example, by evaporation under vacuum, and a layer 24 of a photoresist deposited on top of the metal layer 22 by spin coating techniques, for example. The photoresist layer 24 of FIG. 2a is irradiated through a mask and then developed using well-known photolithographic processes to produce the photoresist pattern 25 of FIG. 2b. Next, an appropriate etchant is applied to remove the portions of the metal layer which are exposed by the openings in the photoresist pattern 25. After etching, the structure of FIG. 2c results, having the photoresist pattern 25 and a similar metal pattern 23 beneath the pattern 25. Finally, the photoresist pattern 25 is removed with an appropriate solvent, to produce the structure of FIG. 2d which has a metal pattern 23 on the surface of the substrate 20. The disadvantages of this process have already been discussed.

Figure 3A:
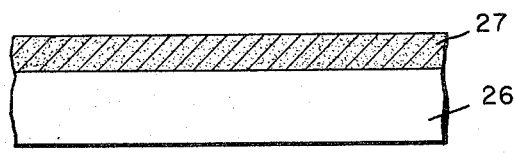
FIG. 3 illustrates, in schematic cross-section, some of the major steps in the process of the present invention used to form a patterned metal-containing film on a substrate.

Turning now to FIG. 3, there are shown some of the major steps in the process of the present invention used to form a patterned film on a substrate. As shown in FIG. 3a, a layer 27 of a metallo-organic photoresist is deposited to a predetermined thickness on the surface of a substrate 26, such as fused silica. The term "photoresist" is used herein to describe a substance which can be polymerized upon exposure to radiation, is liquid and can be applied in a thin layer, has good adhesion to the substrate being used, and has a selective solvent which will dissolve the unpolymerized substance but not the polymerized substance for a negative-acting photoresist (or vice versa for a positive-acting photoresist). The term "metallo-organic photoresist" is used herein to describe a photoresist consisting of an inorganic portion and an organic portion. More specifically, this term is used to describe a photoresist with inorganic constituents substitutionally incorporated into the molecular structure of the radiation-sensitive monomer of the photoresist, for example, a plastic-photopolymer incorporating an inorganic compound such as a metal oxide, halide, or chalcogenide. Metal components which are suitable are those which are capable of cross-linking or of being incorporated in a main chain of a cross-linked polymer during polymerization of the photoresist. For example, a metallo-organic photoresist incorporating lead cross-linked in an acrylate polymer would be formed as follows:

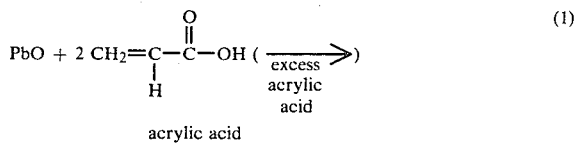

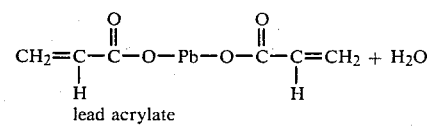

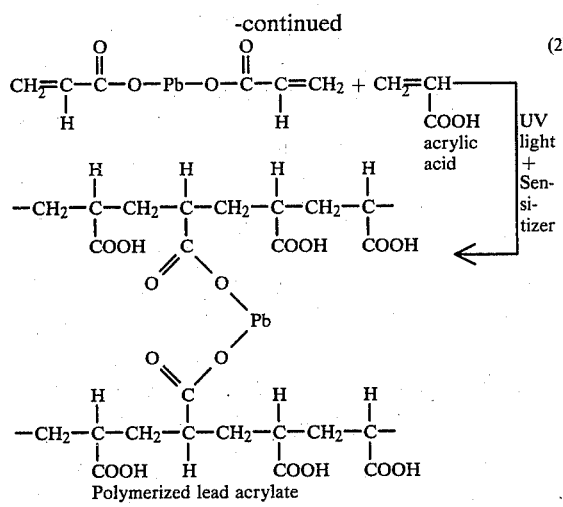

The lead acrylate formed by the reaction of equation (1) above is in a solution of acrylic acid. A sensitizer is added to this solution to improve the absorption of radiation and the solution is exposed to ultraviolet (UV) radiation. Then the reaction shown in equation (2) above occurs, to form the polymerized lead acrylate.

Some suitable cations for the metallo-organic photoresist of the present invention are lead, boron, europium, samarium, praseodymium, lanthanum, copper, iron, yttrium, aluminum, neodymium, tantalum, indium, and tin. In addition, single-cation compositions may be combined to form binary or ternary compositions in a wide range of relative concentrations. Some of these combinations are: lead and boron; lead and europium; lead and samarium; lead and praseodymium; yttrium, aluminum, and iron; and yttrium, aluminum, and neodymium. Cations which are not capable of cross-linking but are incorporated in a main polymer chain during polymerization of the photoresist, for example, alkali metal and other monovalent cations, may be employed as auxiliary cations along with a polyvalent cation capable of cross-linking. For example, lithium can be used as an auxiliary to niobium to form a lithium niobate residue.

The metallo-organic photoresists used in the present invention must be transparent to polymerizing radiation in order to obtain good lithographic reproducibility without imposing limitations on the thickness of the film deposited. The plastic portion of the metallo-organic photoresist may be an acrylate, except in the case of boron, tantalum and titanium where the alcoholate derivative of hydroxyethyl acrylate is used. These acrylates have the advantage of being capable of being developed with a water-based solution. Other photopolymers which may be used are Photozid (the reaction product of a maleic anhydride copolymer with a hydroxyl terminated arenesulfonyl azide, obtained from The Upjohn Company, Kalamazoo, Mich.) or an alkyd resin. In order to improve the absorption efficiency of the plastic photoresist, a sensitizer is used. Paramethoxyphenyl glyoxylic acid is used as a sensitizer for the acrylates whenever there is a small amount or no water in the monomer; in other cases, 2,3,5-triphenyl-2H-tetrazolium chloride is used as the sensitizer. The polymer formed by exposure to radiation must be of the cross-linking or network type that pyrolyzes before it melts, in order to preserve the desired configuration of the film finally formed. The desired cation may be incorporated in the cross-linked portion or a main chain of the polymer.

Figure 3B:
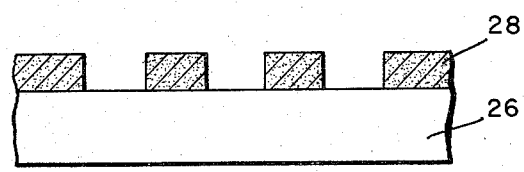

Returning now to FIG. 3, the metallo-organic photoresist layer 27 is irradiated through a mask to form a desired pattern and is then developed using standard photolithographic procedures, to remove the unwanted portions of the photoresist layer and to leave the photoresist pattern 28 as shown in FIG. 3b. Next, the structure of FIG. 3b is placed in a chamber containing a chosen reactive atmosphere and heated to a temperature sufficient to burn the organic portion of the metallo-organic photoresist to form carbon dioxide and water which dissipate as gases. After combustion of the organic portion of the photoresist, an inorganic residue remains on the substrate as the pattern 29 shown in FIG. 3c, which replicates the photoresist pattern 28. The reactive atmosphere in which heating is performed is selected to be one which is suitable to cause formation of the desired inorganic compound or element, in a manner similar to the process disclosed in the U.S. Pat. No. 3,932,597, assigned to the present assignee. For example, the lead acrylate metallo-organic photoresist of equation (2) above may be heated in the presence of oxygen to form a PbO residue. Similarly, a residue comprising a chalcogenide compound of the selected cation may be formed by heating the metallo-organic photoresist in the presence of $CZ_2$ or $H_2Z$, where Z is sulfur, selenium or tellurium. A residue comprising a halide compound of the selected cation may be formed by heating the metallo-organic photoresist in the presence of $X_2$, $CX_4$, or HX, where X is fluorine, chlorine, bromine or iodine.

Thus, the process of the present invention offers the advantage of eliminating two steps from the prior art process of FIG. 1 (namely, depositing the layer of the desired substance and lifting off the photoresist). The process of the present invention likewise offers the advantage of eliminating three steps from the prior art process of FIG. 2 (namely, depositing the metal layer, etching, and lifting off the photoresist). By reducing the number of steps in the prior art processes, the present invention reduces the possibility of contamination and increases the purity of the end product. In addition, when fewer steps are involved, the reproducibility of a lithographic process will usually be increased. Furthermore, the speed of the total process of the present invention is increased over the prior art processes by virtue of the elimination of the time-consuming step of metal evaporation. In addition, the problem of undercutting in the prior art process of FIG. 2 is avoided in the present invention by eliminating the use of etchants. Finally, the present invention provides a simplified process for depositing a layer of a desired substance which does not require complex and expensive vacuum deposition apparatus as do the prior art processes.

Figure 3C:
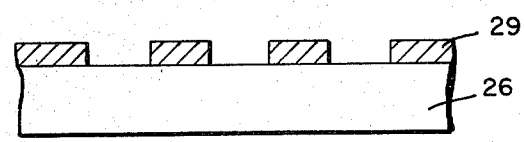

If the layer 29 of FIG. 3c is the desired compound, for example, an oxide, the process of the present invention may be considered completed at this point. Optionally, processing may be continued in order to convert the compound in the pattern 29 of FIG. 3c to a desired compound. (This optional step is not illustrated.) To accomplish this step, the structure of FIG. 3c is exposed to a second reactive atmosphere under conditions appropriate for a chemical reaction to occur with the residue. For example, a metal oxide layer 29 which may form when heat is applied to burn the organic portion of the photoresist can subsequently be heated in the presence of a chalcogen (sulfur, selenium, or tellurium)

vapor to be converted into a metal chalcogenide. A metal residue may be heated in the presence of a halogen (fluorine, chlorine, bromine, or iodine) to form the corresponding metal halide. Similarly, a metal oxide residue may be heated in a reducing atmosphere or a passive atmosphere to form the free metal. Reactive metals such as iron, lead, chromium, aluminum, and bismuth require a reducing atmosphere, whereas the noble metals such as copper, silver, gold and platinum require the passive atmosphere of a neutral gas such as nitrogen, helium, or argon.

Figure 4A:
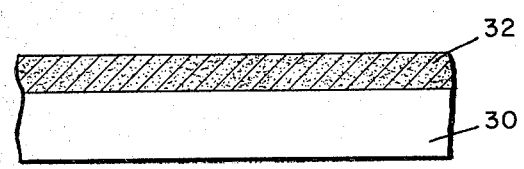
FIG. 4 illustrates, in schematic cross-section, some of the major steps in the process of the present invention used to form a continuous film on a substrate.
Figure 4B:
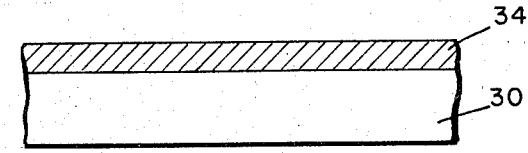

Directing attention now to FIG. 4, there are shown some of the major steps in the process of the present invention used to form a continuous (i.e., unpatterned) film, such as a dielectric layer, on the surface of a substrate. As shown in FIG. 4a, a layer 32 of a metallo-organic photoresist is deposited on the surface of a substrate 30 as described above for FIG. 3. Next, heat is applied to the structure of FIG. 4a in a chosen reactive atmosphere to achieve an elevated temperature sufficient to burn the organic portion of the metallo-organic photoresist to form carbon dioxide and water which dissipate as gases. After combustion of the organic portion, a continuous film 34 shown in FIG. 4b remains as an inorganic residue on the surface of the substrate 30. As an option, the residue may subsequently be exposed to an appropriate chemical vapor as discussed above for FIG. 3, in order to convert the residue to a desired chemical substance. (This optional step is not illustrated.) Thus, the process of the present invention offers the advantage of eliminating the complex, expensive, and time-consuming step in the prior art process which required vacuum and evaporation procedures. Further, by practicing the present invention, layers of controlled composition may be deposited, which was not easily attained by the prior art processes.

Figure 5A:
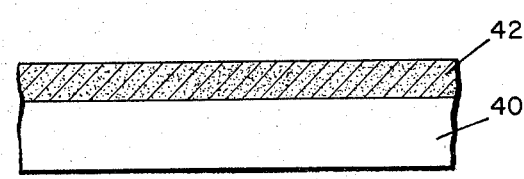
FIG. 5 illustrates, in schematic cross-section, some of the process steps of the present invention used to form an optical waveguide device.
Figure 5B:
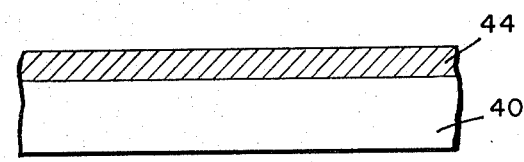
Figure 5C:
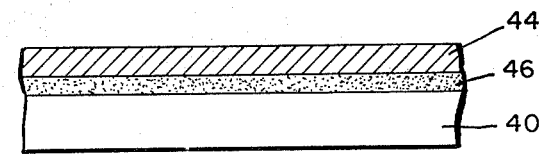

FIG. 5 illustrates some of the process steps of the present invention used to form an optical waveguide device. FIG. 5a shows a layer 42 of a metallo-organic photoresist deposited on the surface of a substrate 40 in a manner similar to that described in FIG. 3 above. The composition of the photoresist layer must be such that the residue subsequently formed will be transparent and the diffused layer subsequently formed will have an index of refraction greater than that of the substrate so that light waves will be substantially reflected at the interface boundary between the diffused layer and the underlying substrate and be thereby confined to propagation in the diffused layer. Next, the structure of FIG. 5a is heated in a chosen reactive atmosphere to a temperature sufficient to burn the organic portion of the metallo-organic photoresist to form carbon dioxide and water which dissipate as gases. After combustion of the organic portion, a continuous film 44 shown in FIG. 5b remains as an inorganic residue on the surface of the substrate 40. Next, heat is applied to the structure of FIG. 5b which is sufficient to cause the inorganic compound in the residue to diffuse into the substrate to form diffused region 46. The temperature for diffusion depends on both the material being diffused and the substrate, with lead oxide, for example, being diffused into vitreous silica at 650° C. for 16 hours. After diffusion has been completed, the device thus formed has optical waveguiding properties.

The details of the process of the present invention are more completely described in the following examples.

EXAMPLE 1

This example illustrates the use of the process of the present invention in order to deposit a phosphor layer, which may be used for information displays such as cathode ray or TV picture tubes or for light addressed phosphor devices.

A vitreous silica substrate was coated with a photoresist liquid comprising a one molar solution of barium-lead acrylate containing benzene sulfinate and Michler's ketone (4:4'-bisdimethylaminothiobenzophenone) using a known spin coating technique in which, for example, a plurality of substrates are placed on a support table, provided with a few drops of the coating solution, and then rotated with circular rotational speed sufficient to centrifugally spin the coating solution uniformly and radially across the upper surfaces of the substrates. (Optionally, the photoresist liquid may be sprayed onto the substrate). The photoresist layer was deposited to a thickness of 25 microns to 100 microns. After the photoresist layer was dried, it was exposed through a mask to blue light (from a mercury or tungsten lamp). A water-insoluble image was formed and the photoresist was developed with water acidified with acetic acid. Then the resulting structure was heated to 1200° C. in air for 16 hours. The barium-lead acrylate was combusted to barium-lead oxide which remained as a residue on the surface of the substrate. Optionally, instead of performing the pyrolysis in air, pyrolysis may be performed in a chemically reactive atmosphere. For example, if pyrolysis of the barium-lead acrylate residue is performed in an atmosphere of hydrogen sulfide gas, the resulting product is a barium-lead sulfide deposit.

In addition, it has been found that a metallo-organic photoresist incorporating lead and europium or lead and samarium when processed in accordance with the present invention will leave an oxide residue which fluoresces in the visible region of the spectrum under ultraviolet excitation.

EXAMPLE 2

This example illustrates the use of the process of the present invention in order to form a planar geometry optical waveguide device. A silica substrate was spin coated with a 100 micron thick layer of a metallo-organic photoresist composition comprising one part of polymethylmethacrylate, one part of Photozid, 0.1 part of phenylglyoxylic acid, and four parts of germanium oxide in acetone. (The parts cited are by weight). Coating was performed using well-known spin coating techniques. The film thus formed was exposed through a mask to ultraviolet light (from a 500 watt mercury arc lamp) for one minute to form a pattern. The pattern was developed with acetone. Then, the resulting structure was heated in oxygen to at least 400° C. for two hours to burn the organic polymer to form gaseous products and to leave a germanium oxide residue on the substrate. Continued heating of the structure at 1200° C. for 16 hours caused the germanium oxide first to be sintered and then to diffuse into the substrate. The structure thus formed was observed to have waveguiding properties.

In a manner similar to that described above, a layer of titanium dioxide could be formed on a lithuim niobate substrate and then diffused into the substrate to form a waveguiding layer. The metallo-organic photoresist composition would comprise an alcoholate of titanium, 2-hydroxyethyl acrylate, and a photosensitizer.

EXAMPLE 3

A patterned barium lead oxide layer was deposited on quartz as follows. A quartz substrate was spin coated with a 100 micron thick layer of a composition comprising a barium-lead acrylate aqueous solution with phenylglyoxylic acid as a sensitizer. (Optionally ammonium paratoluenesulfuric acid as a redox agent and methylene blue as a sensitizer may be used). The film thus formed was exposed through a mask to ultraviolet light (from a 500 watt mercury arc lamp) for one minute to form a pattern. The unexposed area of the pattern was washed off with water. The resulting structure was heated in oxygen in a furnace at 1000° C. for 30 minutes. A clear barium lead oxide image was formed.

EXAMPLE 4

In a manner similar to that described in Example 3, except that barium was omitted from the acrylate, lead oxide films having thicknesses ranging from 100 Å to 4000 Å were deposited on fused silica substrates. Heating was performed at 650° C.

EXAMPLE 5

A film of $SiO_2$ was deposited on a silicon substrate as follows. A metallo-organic photoresist solution comprising divinyldiacetoxysilane and 2-hydroxyethyl acrylate (the latter used to accomplish cross-linking) was deposited on the surface of a silicon substrate by known spin coating techniques. The structure was then heated in oxygen in a furnace at 650° C. for 16 hours. After heating, a film of $SiO_2$ was left as a residue on the surface of the silicon substrate. Films of $SiO_2$ up to 1200 Å thick have been formed by this process.

EXAMPLE 6

A film of copper was deposited on a silicon substrate as follows. A metallo-organic photoresist solution comprising cupric acrylate, acrylic acid, and p-methoxyphenyl glyoxylic acid was deposited on the surface of a silicon substrate by known spin coating techniques. Then, the structure was heated in oxygen at 650° C. for 16 hours to pyrolyze the organic portion of the photoresist and simultaneously convert the inorganic portion to sintered cupric oxide. Finally, the structure was heated in hydrogen at 800° C. for one hour to reduce the cupric oxide residue to metallic copper. The process described above was also used to deposit a film of copper on vitreous silica.

While the present invention has been particularly described with respect to a preferred sequence of process steps to deposit a film of controlled composition, it will be understood that the invention is not limited to the particular process steps, their sequence, or the final structures depicted in the drawings. On the contrary, it is intended to cover all alternatives, modifications, and equivalents as may be included within the spirit and scope of the invention defined by the appended claims. In particular, the scope of the invention is intended to include processes for depositing metals, alloys, intermetallic compounds, and dielectric substances. It is further anticipated that the process of the present invention may be used to deposit semiconductor substances, for example, gallium arsenide by using gallium acrylate and an organic derivative of arsene ($AsH_3$) or silicon by using an organic derivative of silane ($SiH_4$). In addition, while the deposition of polycrystalline and amorphous films of a desired substance has already been accomplished, it is expected that a film of single crystalline structure can also be achieved by the present invention. The process of the present invention may be used to fabricate a variety of electronic and optical devices and may also be used in the fabrication of solar cells to form, for example, anti-reflective coatings and insulating layers. Furthermore, the present invention includes photolithographic processes and other lithographic processes such as those using electron beams, ion beams and x-rays.

What is claimed is:

1. A process for depositing a film of controlled composition on a substrate comprising the steps of:
    (a) providing a polymerizable material which is suitable for use as a photoresist;
    (b) introducing into said polymerizable material a predetermined amount of a chosen substance containing a selected cation and which is capable of being chemically linked to said polymerizable material upon polymerization, to form a cation-containing polymerizable material;
    (d) polymerizing said cation-containing polymerizable material to form a metallo-organic photoresist of chosen composition having said cation substitutionally incorporated therein; and
    (c) depositing said cation-containing polymerizable material on said substrate to a predetermined thickness;
    (e) heating said deposited metallo-organic photoresist in a selected reactive atmosphere to elevated temperatures sufficient to combust the organic portion of said metallo-organic photoresist and to leave behind on said substrate an inorganic residue which contains said selected cation.

2. The process as set forth in claim 1 which further comprises the step of: defining a predetermined pattern in said photoresist during said polymerizing of step "d".

3. The process as set forth in claim 2 wherein said substrate is fused silica, said chosen composition comprises a lead-containing compound, and said residue is a lead-containing oxide having a thickness of 100 Å to 4000 Å.

4. The process as set forth in claim 1 wherein said selected reactive atmosphere comprises a material containing a substance selected from the group consisting of fluorine, chlorine, bromine, iodine, sulfur, selenium, tellurium, oxygen, hydrogen, nitrogen, helium, argon, and air.

5. The process as set forth in claim 1 or claim 2 which further comprises the step of exposing said residue to a second chosen reactive atmosphere to form a reaction product with said residue.

6. The process as set forth in claim 5 wherein said reaction product is chosen from the group consisting of an oxide, a halide, a chalcogenide, and a free element.

7. The process as set forth in claim 1 which further comprises the step of heating said substrate having said residue deposited thereon to elevated temperatures sufficient to diffuse at least a portion of said residue into said substrate to thereby form an optical waveguiding region.

8. The process as set forth in claim 1 wherein said inorganic residue contains a phosphorescent material.

9. The process as set forth in claim 1 wherein said cation is selected from the group consisting of lead, boron, europium, samarium, praseodymium, lanthanum, copper, iron, yttrium, aluminum, neodymium, tantalum, indium, tin, and binary and ternary mixtures thereof.

* * * * *